United States Patent
Koyo et al.

(10) Patent No.: US 11,661,519 B2
(45) Date of Patent: May 30, 2023

(54) LOW-REFLECTION FILM-COATED TRANSPARENT SUBSTRATE, PHOTOELECTRIC CONVERSION DEVICE, COATING LIQUID FOR FORMING LOW-REFLECTION FILM OF LOW-REFLECTION FILM-COATED TRANSPARENT SUBSTRATE, AND METHOD FOR PRODUCING LOW-REFLECTION FILM-COATED TRANSPARENT SUBSTRATE

(71) Applicant: Nippon Sheet Glass Company, Limited, Tokyo (JP)

(72) Inventors: Mizuho Koyo, Hyogo (JP); Tatsuhiro Nakazawa, Hyogo (JP); Mitsuhiro Kawazu, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 632 days.

(21) Appl. No.: 16/608,602

(22) PCT Filed: Apr. 19, 2018

(86) PCT No.: PCT/JP2018/016161
§ 371 (c)(1),
(2) Date: Oct. 25, 2019

(87) PCT Pub. No.: WO2018/198936
PCT Pub. Date: Nov. 1, 2018

(65) Prior Publication Data
US 2021/0115263 A1    Apr. 22, 2021

(30) Foreign Application Priority Data
Apr. 27, 2017   (JP) ............................. JP2017-088245

(51) Int. Cl.
| | | |
|---|---|---|
| C09D 5/00 | (2006.01) | |
| C09D 7/40 | (2018.01) | |
| C03C 17/25 | (2006.01) | |
| C09D 1/00 | (2006.01) | |
| G02B 1/111 | (2015.01) | |
| H01L 31/0216 | (2014.01) | |
| C09D 7/20 | (2018.01) | |

(52) U.S. Cl.
CPC .............. *C09D 5/006* (2013.01); *C03C 17/25* (2013.01); *C09D 1/00* (2013.01); *C09D 7/20* (2018.01); *C09D 7/67* (2018.01); *C09D 7/68* (2018.01); *C09D 7/70* (2018.01); *G02B 1/111* (2013.01); *H01L 31/02168* (2013.01)

(58) Field of Classification Search
CPC ..... H01L 31/02168; C09D 5/006; C09D 7/20; C09D 7/67; C09D 7/68; C09D 7/70; C09D 1/00; C03C 17/25; G02B 1/111
See application file for complete search history.

(56) References Cited

U.S. PATENT DOCUMENTS

| | | | | |
|---|---|---|---|---|
| 6,051,665 A | * | 4/2000 | Yamada .............. | C08G 77/442 525/477 |
| 6,620,493 B2 | * | 9/2003 | Hasegawa ............ | C09D 183/06 351/159.6 |
| 2007/0042173 A1 | * | 2/2007 | Nagaoka .............. | C08F 214/18 428/323 |
| 2007/0285776 A1 | * | 12/2007 | Nakamura ........... | G02B 5/3083 359/586 |
| 2008/0223430 A1 | * | 9/2008 | Krasnov ............ | C03C 17/3678 204/192.1 |
| 2011/0039081 A1 | | 2/2011 | Murouchi et al. | |
| 2011/0274878 A1 | | 11/2011 | Makino et al. | |
| 2013/0163087 A1 | | 6/2013 | Lecolley et al. | |
| 2015/0177425 A1 | | 6/2015 | Kondo et al. | |

(Continued)

FOREIGN PATENT DOCUMENTS

| | | |
|---|---|---|
| JP | 2009280786 | 12/2009 |
| JP | 2011251890 | 12/2011 |

(Continued)

OTHER PUBLICATIONS

Extended European Search Report issued for European Patent Application No. 18791143.3, dated Jan. 18, 2021, 6 pages.

(Continued)

*Primary Examiner* — Tamir Ayad
(74) *Attorney, Agent, or Firm* — Hamre, Schumann, Mueller & Larson, P.C.

(57) ABSTRACT

A low-reflection film-coated transparent substrate of the present invention includes a transparent substrate and a low-reflection film formed on at least one principal surface of the transparent substrate. The low-reflection film is a porous film including: fine silica particles being solid and spherical and having an average particle diameter of 80 to 150 nm; and a binder containing silica as a main component, the fine silica particles being bound by the binder. The binder further contains an aluminum compound. The low-reflection film contains as components: 55 to 70 mass % of the fine silica particles; 25 to 40 mass % of the silica of the binder; 0.1 to 1.5 mass % of the aluminum compound in terms of $Al_2O_3$; and 0.25 to 3% of an organic component. The low-reflection film has a thickness of 80 to 800 nm. A transmittance gain is 2.5% or more, the transmittance gain being defined as an increase of average transmittance of the low-reflection film-coated transparent substrate in a wavelength range of 380 to 850 nm relative to average transmittance of the transparent substrate uncoated with the low-reflection film in the wavelength range. The organic component includes at least one selected from the group consisting of a ß-ketoester and a ß-diketone.

13 Claims, No Drawings

(56) References Cited

U.S. PATENT DOCUMENTS

2015/0276991 A1 10/2015 Uchimura et al.
2017/0243989 A1 8/2017 Koyo et al.
2019/0011604 A1* 1/2019 Wakizaka .............. C09D 5/006

FOREIGN PATENT DOCUMENTS

| JP | 2013537873 | 10/2013 |
| JP | 2013228643 | 11/2013 |
| JP | 2014015543 | 1/2014 |
| JP | 2014032248 | 2/2014 |
| WO | 2016051750 | 4/2016 |

OTHER PUBLICATIONS

International Search Report and Written Opinion issued for International Patent Application No. PCT/JP2018/016161, dated Jul. 3, 2018, 9 pages including English translation of Search Report.

* cited by examiner

LOW-REFLECTION FILM-COATED TRANSPARENT SUBSTRATE, PHOTOELECTRIC CONVERSION DEVICE, COATING LIQUID FOR FORMING LOW-REFLECTION FILM OF LOW-REFLECTION FILM-COATED TRANSPARENT SUBSTRATE, AND METHOD FOR PRODUCING LOW-REFLECTION FILM-COATED TRANSPARENT SUBSTRATE

TECHNICAL FIELD

The present invention relates to a low-reflection film-coated transparent substrate, a photoelectric conversion device including the same, a coating liquid for forming a low-reflection film of a low-reflection film-coated transparent substrate, and a method for producing a low-reflection film-coated transparent substrate.

BACKGROUND ART

For the purpose of improving the function of a glass or ceramic substrate in its intended use, a low-reflection film for increasing the amount of light to be transmitted or for preventing glare caused by reflection is formed on the surface of the substrate.

Such low-reflection films are applied, for example, to glass sheets for use in vehicle glass panes, show-windows, or photoelectric conversion devices. A so-called thin-film solar cell, which is a type of photoelectric conversion device, employs a glass sheet on which is formed a stack of an underlayer film, a transparent conductive film, a photoelectric conversion layer made of amorphous silicon or the like, and a back-side thin-film electrode that are arranged in this order. A low-reflection film is formed on the principal surface of the glass sheet opposite to the principal surface bearing the stack, namely on the principal surface on which sunlight is incident. Such a solar cell having a low-reflection film formed on the sunlight-incident side allows an increased amount of sunlight to reach the photoelectric conversion layer or solar cell element and thus generates an increased amount of electricity.

The most commonly used low-reflection films are dielectric films formed by a process such as vacuum deposition, sputtering, or chemical vapor deposition (CVD). In some cases, a fine particle-containing film containing fine particles such as fine silica particles is used as a low-reflection film. Such a fine particle-containing film is formed by applying a coating liquid containing fine particles onto a transparent substrate by a technique such as dipping, flow coating, or spraying.

For example, JP 2014-032248 A (Patent Literature 1) discloses a cover glass for photoelectric conversion devices that is formed by applying a coating liquid containing fine particles and a binder precursor to a glass sheet having surface asperities by spraying, followed by drying at 400° C. and then by calcining at 610° C. for 8 minutes. The low-reflection film formed in this cover glass can produce an increase of at least 2.37% in the average light transmittance in the wavelength range of 380 to 1100 nm.

Furthermore, JP 2013-537873 A (Patent Literature 2) discloses a coated glass substrate produced by depositing a sol containing tetraethoxysilane, aluminum acetylacetonate, and colloidal silica on a glass sheet by dip coating, followed by heat treatment at 680° C. for 180 seconds. The low-reflection film formed in this glass substrate can produce an increase of 2.5% in the average light transmittance in the wavelength range of 300 to 1100 nm.

JP 2014-015543 A (Patent Literature 3) discloses a silicon substrate with a coating formed by applying a coating composition containing colloidal silica, tetraalkoxysilane, and aluminum nitrate to the substrate using a spin coater and then by drying the applied coating composition at 100° C. for 1 minute, the colloidal silica having a dispersed particle diameter larger than an average primary particle diameter and having a shape factor and aspect ratio that are larger than 1 by a certain amount or more. This coating has a refractive index of 1.40 or less, although no mention is made of the increase in average light transmittance brought about by this coating.

CITATION LIST

Patent Literature

Patent Literature 1: JP 2014-032248 A
Patent Literature 2: JP 2013-537873 A
Patent Literature 3: JP 2014-015543 A

SUMMARY OF INVENTION

Technical Problem

For example, when a glass sheet coated with a low-reflection film is used as a transparent substrate in a photoelectric conversion device, the low-reflection film-coated transparent substrate is required not only to have an improving effect on the light transmittance but also to have high durability. Thus, for example, low-reflection film-coated transparent substrates for use in photoelectric conversion devices still have room for improvement in terms of increasing the durability while maintaining good optical properties such as high transmittance comparable to that conventionally achieved.

In view of such circumstances, it is an object of the present invention to provide a low-reflection film-coated transparent substrate having an increased durability as well as having optical properties comparable to those conventionally achieved. It is another object of the present invention to provide a photoelectric conversion device including such a low-reflection film-coated transparent substrate. It is yet another object of the present invention to provide a coating liquid for forming a low-reflection film of such a low-reflection film-coated transparent substrate and provide a method for producing the low-reflection film-coated transparent substrate.

Solution to Problem

A first aspect of the present invention provides a low-reflection film-coated transparent substrate including a transparent substrate and a low-reflection film formed on at least one principal surface of the transparent substrate, wherein
the low-reflection film is a porous film including: fine silica particles being solid and spherical and having an average particle diameter of 80 to 150 nm; and a binder containing silica as a main component, the fine silica particles being bound by the binder,
the binder further contains an aluminum compound,
the low-reflection film contains as components:
55 to 70 mass % of the fine silica particles;
25 to 40 mass % of the silica of the binder;

0.1 to 1.5 mass % of the aluminum compound in terms of $Al_2O_3$; and 0.25 to 3% of an organic component, the low-reflection film has a thickness of 80 to 800 nm, a transmittance gain is 2.5% or more, the transmittance gain being defined as an increase of average transmittance of the low-reflection film-coated transparent substrate in a wavelength range of 380 to 850 nm relative to average transmittance of the transparent substrate uncoated with the low-reflection film in the wavelength range, and the organic component includes at least one selected from the group consisting of a ß-ketoester and a ß-diketone.

A second aspect of the present invention provides a photoelectric conversion device including the low-reflection film-coated transparent substrate according to the first aspect of the present invention.

A third aspect of the present invention provides a coating liquid for forming a low-reflection film of a low-reflection film-coated transparent substrate, the coating liquid including: fine silica particles being solid and spherical and having an average particle diameter of 80 to 150 nm; a hydrolyzable silicon compound; an aluminum chelate complex; and a solvent, wherein the hydrolyzable silicon compound includes a compound represented by the following formula (I): $SiX_4$, where X is at least one selected from an alkoxy group, an acetoxy group, an alkenyloxy group, an amino group, and a halogen atom, the aluminum chelate complex contains: at least one polydentate ligand selected from the group consisting of a polydentate ligand having a ß-ketoester structure and a polydentate ligand having a ß-diketone structure; and one or two alkoxy groups directly bonded to the aluminum atom, the solvent includes an organic solvent miscible with water and having a boiling point of 70° C. or higher and lower than 180° C., a ratio between the mass of the fine silica particles, as calculated in terms of $SiO_2$, and the mass of a silicon oxide component contained in the hydrolyzable silicon compound, as calculated in terms of $SiO_2$ (fine silica particles:hydrolyzable silicon compound), is 57:43 to 74:26, when a sum of the mass of the fine silica particles, as calculated in terms of $SiO_2$, and the mass of the silicon oxide component contained in the hydrolyzable silicon compound, as calculated in terms of $SiO_2$, is defined as 100 parts by mass, the amount of the aluminum chelate complex is 0.6 to 8 parts by mass, and when a low-reflection film having a thickness of 80 to 800 nm is formed on a transparent substrate using the coating liquid, a transmittance gain is 2.5% or more, the transmittance gain being defined as an increase of average transmittance of the low-reflection film-coated transparent substrate in a wavelength range of 380 to 850 nm relative to average transmittance of the transparent substrate uncoated with the low-reflection film in the wavelength range.

A fourth aspect of the present invention provides a method for producing a low-reflection film-coated transparent substrate according to the first aspect of the present invention, the method including:

an application step of applying a coating liquid for forming the low-reflection film to the transparent substrate; and a heating step of heating the transparent substrate with the coating liquid applied, wherein the coating liquid is the coating liquid according to the third aspect of the present invention, and in the heating step, a maximum temperature experienced by a surface of the transparent substrate is 350° C. or lower, and a period of time during which the surface of the transparent substrate has a temperature of 130° C. or higher is 5 minutes or less.

Advantageous Effects of Invention

The present invention can provide a low-reflection film-coated transparent substrate having an increased durability as well as having optical properties comparable to those conventionally achieved. The present invention can further provide a photoelectric conversion device including such a low-reflection film-coated transparent substrate.

DESCRIPTION OF EMBODIMENTS

An embodiment of the low-reflection film-coated transparent substrate according to the present invention will be described.

The low-reflection film-coated transparent substrate of the present embodiment includes a transparent substrate and a low-reflection film formed on at least one principal surface of the transparent substrate.

The low-reflection film will be described first.

The low-reflection film in the present embodiment is composed of a porous film including fine silica particles being solid and spherical and a binder containing silica as a main component, the fine silica particles being bound by the binder. The binder further contains an aluminum compound. The porous film, namely the low-reflection film, has a physical thickness of 80 to 800 nm, preferably more than 100 nm and 500 nm or less, more preferably more than 100 nm and 150 nm or less. The "binder containing silica as a main component" refers to a binder containing 50 mass % or more of silica.

The fine silica particles are approximately spherical primary particles having an average particle diameter of 80 to 150 nm, preferably more than 100 nm and 150 nm or less. Silica has higher hardness than organic polymer materials. Silica has a relatively low refractive index, thus being capable of offering a greater reduction in the apparent refractive index of the porous film including the binder and the fine silica particles. Furthermore, approximately spherical primary particles made of silica and having uniform diameters are commercially manufactured at low cost and are highly available in terms of quantity, quality, and cost. The "average particle diameter" of the fine silica particles, as defined herein, refers to a particle diameter (D50) at 50% cumulative volume in a particle size distribution measured by laser-diffraction particle size distribution analysis.

The content of the aluminum compound in the low-reflection film is 0.1 to 1.5 mass %, preferably 0.2 to 1.0 mass %, in terms of $Al_2O_3$.

The aluminum compound contained in the binder is preferably an aluminum chelate complex. When the binder contains the aluminum compound in an amount within the above range in terms of $Al_2O_3$, the low-reflection film can gain an increase in durability, particularly in abrasion resistance after contact with water for a long period of time, while maintaining good optical properties.

Aluminum chelate complexes that can be used are those containing at least one polydentate ligand selected from the group consisting of a polydentate ligand having a ß-ketoester structure and a polydentate ligand having a ß-diketone structure. That is, at least one polydentate ligand of the aluminum chelate complex used may be a ligand having a ß-ketoester structure and/or a ß-diketone structure. All of the polydentate ligands contained in the aluminum chelate complex may have a ß-ketoester structure. An aluminum chelate complex containing such a polydentate ligand is highly stable in a coating liquid for forming the low-reflection film.

The aluminum chelate complex may contain one or two alkoxy groups directly bonded to the aluminum atom and a polydentate ligand having a ß-ketoester structure or a ß-diketone structure. In this case, the number of carbon atoms in the or each alkoxy group is preferably, for example, 1 to 8. The or each alkoxy group may be, for example, at least one selected from the group consisting of an i-propoxy group, a n-butoxy group, and a sec-butoxy group. It is considered that when the aluminum chelate complex contains an alkoxy group directly bonded to the aluminum atom, a cross-linked structure having the aluminum atom as a central element can be introduced into the binder.

When the aluminum chelate complex contains a polydentate ligand having a ß-ketoester structure, it is preferable that in this ß-ketoester structure, the number of carbon atoms in the carboxylic acid constituting the ester be 4 to 6 and the number of carbon atoms in the alcohol constituting the ester be 1 to 3. It is more preferable that in the ß-ketoester structure, the number of carbon atoms in the carboxylic acid constituting the ester be 4 and the number of carbon atoms in the alcohol constituting the ester be 2.

Examples of aluminum chelate complexes suitable for use as the aluminum chelate complex contained in the binder are those containing ethyl acetoacetate, acetylacetonate, methyl acetoacetate, isopropyl acetoacetate, ethyl 3-oxopentanoate, or ethyl 3-oxo-4-methylpentanoate as a polydentate ligand.

The low-reflection film contains an organic component in an amount of 0.2 to 3 mass %, preferably 0.4 to 2.1 mass %. This organic component includes at least one selected from the group consisting of a ß-ketoester and a ß-diketone. For example, when the aluminum compound is an aluminum chelate complex, the organic component includes an organic component derived from a ligand of the aluminum chelate complex. The organic component may contain an alkyl group. The alkyl group may be, for example, a methyl group or ethyl group.

The content of the fine silica particles in the low-reflection film is 55 to 70 mass % and preferably 60 to 70 mass %. The content of the silica of the binder is 25 to 40 mass % and preferably 30 to 40 mass %.

The ratio between the content of the fine silica particles and the content of the silica of the binder (fine silica particles:silica of binder) in the low-reflection film is in the range of 57:43 to 74:26, preferably in the range of 60:40 to 70:30, in terms of mass ratio. The higher the content ratio of the fine silica particles is, the greater the reflectance-reducing effect of the low-reflection film of the present embodiment can be. This is due to an increase in the void between the fine silica particles themselves or between the fine particles and transparent substrate. If, however, the content ratio of the fine silica particles is excessively high, the durability of the low-reflection film of the present embodiment will deteriorate. This is because an excessively high content ratio of the fine silica particles results in a reduction in the effect of that silica of the binder which serves to bond the fine silica particles together or bond the fine particles to the transparent substrate. If the content ratio of the fine silica particles is excessively low, the void mentioned above will be too narrow, with the result that the reflectance-reducing effect of the low-reflection film of the present embodiment will decrease.

As the source of the silica of the binder, a hydrolyzable silicon compound or a hydrolysate of the hydrolyzable silicon compound can be used. This hydrolyzable silicon compound may include a compound represented by the formula (I) below. In the formula (I), X is at least one selected from the group consisting of an alkoxy group, an acetoxy group, an alkenyloxy group, an amino group, and a halogen atom.

As described above, a hydrolyzable silicon compound typified by a silicon alkoxide can be used as the source of the silica of the binder. Examples of the silicon alkoxide include tetramethoxysilane, tetraethoxysilane, tetraisopropoxysilane, methyltriethoxysilane, methyltrimethoxysilane, ethyltriethoxysilane, and ethyltrimethoxysilane. These hydrolyzable silicon compounds can be formed into a binder through hydrolysis and polycondensation by a so-called sol-gel process.

The hydrolysis of the hydrolyzable silicon compound can be carried out in any appropriate manner. The hydrolysis is preferably carried out in a solution containing the fine silica particles described above, because this promotes a polycondensation reaction between silanol groups present on the surfaces of the fine particles and silanol groups formed by hydrolysis of the hydrolyzable silicon compound such as a silicon alkoxide, thus leading to an increase in the proportion of the binder contributing to enhancement of bond strength between the fine silica particles. Specifically, it is preferable to prepare a coating liquid for forming the low-reflection film by sequentially adding a hydrolysis catalyst and a silicon alkoxide to a solution containing the fine silica particles while stirring the solution.

Either an acid or a base can be used as the hydrolysis catalyst. Acids, in particular inorganic acids such as hydrochloric acid, nitric acid, sulfuric acid, and phosphoric acid, are preferably used, and hydrochloric acid is more preferably used. This is because acidic conditions allow better dispersion of the fine silica particles and yield higher stability of the coating liquid than basic conditions. It is desirable to use as the hydrolysis catalyst an acid having a high degree of electrolytic dissociation in an aqueous solution. Specifically, it is desirable to use an acid having an acid dissociation constant pKa (which refers to the first acid dissociation constant when the acid is a polybasic acid) of 2.5 or less.

Next, the transparent substrate used in the low-reflection film-coated transparent substrate of the present embodiment will be described.

For example, a glass sheet or a substrate composed of an organic polymer is used as the transparent substrate. Examples of the substrate composed of an organic polymer include sheets and films made of acrylic resin, polycarbonate resin, polystyrene resin, or polyester resin. An example where a glass sheet is used as the transparent substrate is described herein.

The glass sheet is not limited to a particular one. To allow the low-reflection film provided on a principal surface of the glass sheet to have a smooth surface, the glass sheet is preferably a glass sheet having a microscopically smooth surface. For example, the glass sheet may be a float glass sheet having a principal surface having such a smoothness that the arithmetic average roughness Ra is, for example, 1 nm or less and preferably 0.5 nm or less. The arithmetic average roughness Ra as described herein corresponds to that as specified in JIS B 0601-1994.

The glass sheet may be a figured glass sheet with a surface having macroscopic asperities which are large enough to be observed with the naked eye. The macroscopic asperities as described herein refer to asperities for which the mean spacing Sm is on the order of millimeters as determined by setting an evaluation length on the order of centimeters in the roughness profile. The mean spacing Sm of the asperities on the surface of the figured glass sheet is preferably 0.3 mm or more, more preferably 0.4 mm or more, and even more preferably 0.45 mm or more, and is preferably 2.5 mm or less, more preferably 2.1 mm or less, even more preferably 2.0 mm or less, and particularly preferably 1.5 mm or less. The mean spacing Sm as described herein refers to an average of lengths of peak-valley periods in the roughness profile which are determined based on points at which the roughness profile intersects the mean line. It is further preferable that the surface asperities of the figured glass sheet have a maximum height Ry of 0.5 μm to 10 μm, in particular 1 μm to 8 μm, as well as having a mean spacing Sm within the above range. The mean spacing Sm and maximum height Ry as described herein correspond to those as specified in JIS (Japanese Industrial Standards) B 0601-1994. Even such a figured glass sheet can have an arithmetic average roughness Ra of several nanometers or less, in particular 1 nm or less, when the figured glass sheet is microscopically examined (such as in surface roughness measurement by atomic force microscope (AFM) observation in which the evaluation length in the roughness profile is several hundreds of nanometers). Thus, the figured glass sheet can be considered a glass sheet having a microscopically smooth surface and can be suitably used as the transparent substrate of the low-reflection film-coated transparent substrate of the present embodiment.

The glass sheet used may have a composition similar to those of common figured glass sheets or architectural glass sheets. The glass sheet is preferably as free of coloring components as possible. In the glass sheet, the content of iron oxide, which is a typical coloring component, is preferably 0.06 mass % or less, in particular 0.02 mass % or less, in terms of $Fe_2O_3$.

The glass sheet may be a glass sheet with a film different from the low-reflection film and formed on a principal surface of the glass sheet opposite to that on which the low-reflection film is to be formed. An example of glass sheets suitable for being provided with the low-reflection film of the present embodiment is a transparent conductive film-coated glass sheet. This transparent conductive film-coated glass sheet is, for example, one which has a transparent conductive film provided on one principal surface of any of the glass sheets as described above and in which one or more underlayers and a transparent conductive layer containing, for example, fluorine-doped tin oxide as a main component are stacked in order on the principal surface of the glass sheet.

The above-described low-reflection film-coated transparent substrate of the present embodiment can exhibit a transmittance gain of 2.5% or more, preferably 2.6% or more, or even 2.7% or more, and can also exhibit high durability. The transmittance gain is related to the surface of the low-reflection film-coated transparent substrate where the low-reflection film is formed, and refers to an increase of the average transmittance of the low-reflection film-coated transparent substrate in a wavelength range of 380 to 850 nm relative to the average transmittance of the transparent substrate uncoated with the low-reflection film in the wavelength range.

The low-reflection film-coated transparent substrate of the present embodiment can be designed so that when the average reflectance of the surface where the low-reflection film is formed is determined in a wavelength range of 360 to 740 nm in the presence and absence of the low-reflection film, a difference calculated by subtracting the average reflectance of the surface in the presence of the low-reflection film from the average reflectance of the surface in the absence of the low-reflection film (reflectance-reducing effect) is 3.0% or more and preferably 3.2% or more. The low-reflection film-coated transparent substrate of the present embodiment can have such excellent reflection properties.

The low-reflection film-coated transparent substrate of the present embodiment also has excellent abrasion resistance. In particular, the low-reflection film-coated transparent substrate of the present embodiment is excellent in the abrasion resistance exhibited after contact with water for a long period of time. For example, when the low-reflection film-coated transparent substrate of the present embodiment is subjected to a post-water immersion dry cloth rubbing test in which the low-reflection film-coated transparent substrate is immersed in water for 50 hours and subsequently the surface formed by the low-reflection film is rubbed with a dry cloth, a difference in average reflectance of the surface formed by the low-reflection film in the wavelength of 360 to 740 nm before and after the test can be, for example, 1% or less or even 0.5% or less.

The low-reflection film-coated transparent substrate of the present embodiment can be formed by applying a coating liquid to a principal surface of a transparent substrate such as a glass sheet to form a wet film and by drying and hardening the wet film. That is, the low-reflection film can be formed by application of a coating liquid for forming the low-reflection film to a transparent substrate, followed by a heating step of drying and hardening the wet film of the coating liquid.

Next, the coating liquid for forming the low-reflection film of the low-reflection film-coated transparent substrate of the present embodiment will be described.

The coating liquid of the present embodiment includes: fine silica particles being solid and spherical and having an average particle diameter of 80 to 150 nm; a hydrolyzable silicon compound; an aluminum chelate complex; and a solvent.

The hydrolyzable silicon compound in the coating liquid includes a compound represented by the following formula (I): $SiX_4$, where X is at least one selected from the group consisting of an alkoxy group, an acetoxy group, an alkenyloxy group, an amino group, and a halogen atom.

Examples of the hydrolyzable silicon compound that can be used include silicon alkoxides such as: tetraalkoxysilanes such as tetramethoxysilane, tetraethoxysilane, and tetraisopropoxysilane; methyltriethoxysilane; methyltrimethoxysilane; ethyltriethoxysilane; and ethyltrimethoxysilane.

The aluminum chelate complex in the coating liquid contains at least one polydentate ligand selected from the group consisting of a polydentate ligand having a ß-ketoester structure and a polydentate ligand having a ß-diketone structure. The aluminum chelate complex may further contain one or two alkoxy groups directly bonded to the aluminum atom. In this case, the number of carbon atoms in the or each alkoxy group is preferably, for example, 1 to 8. The or each alkoxy group may be at least one selected from the group consisting of an i-propoxy group, a n-butoxy group, and a sec-butoxy group. It is considered that when the aluminum chelate complex contains an alkoxy group directly bonded to the aluminum atom, a cross-linked structure having the aluminum atom as a central element can be introduced into the binder.

When the aluminum chelate complex in the coating liquid contains a polydentate ligand having a ß-ketoester structure, it is preferable that in ß-ketoester structure, the number of carbon atoms in the carboxylic acid constituting the ester be 4 to 6 and the number of carbon atoms in the alcohol constituting the ester be 1 to 3. It is more preferable that in the ß-ketoester structure, the number of carbon atoms in the carboxylic acid constituting the ester be 4 and the number of carbon atoms in the alcohol constituting the ester be 2.

Examples of aluminum chelate complexes suitable for use as the aluminum chelate complex in the coating liquid are those containing ethyl acetoacetate, acetylacetonate, methyl acetoacetate, isopropyl acetoacetate, ethyl 3-oxopentanoate, or ethyl 3-oxo-4-methylpentanoate as a polydentate ligand.

The solvent in the coating liquid includes an organic solvent miscible with water. This organic solvent includes an organic solvent having a boiling point of 70° C. or higher and lower than 180° C. Examples of the organic solvent include ethanol (boiling point: 78° C.), 2-propanol (boiling point: 83° C.), 1-methoxy-2-propanol (boiling point: 121° C.), acetylacetone (boiling point: 141° C.), methoxypropyl acetate (boiling point: 146° C.), 3-methoxy-1-butanol (boiling point: 160° C.), diacetone alcohol (boiling point: 168° C.), and 3-methoxy-3-methyl-1-butanol (boiling point: 174° C.). In a preferred embodiment, the organic solvent consists of an organic solvent having a boiling point of 70° C. or higher and lower than 180° C. In another preferred embodiment, the organic solvent includes an organic solvent having a boiling point of 70° C. or higher and lower than 180° C. as a main component and further includes another organic solvent having a higher boiling point. An organic solvent having a boiling point of 180 to 250° C. can be used as the higher boiling point organic solvent. In this case, the rate of drying after application can be slowed to facilitate leveling of the film of the coating liquid, so that effects such as reduction of uneven application and achievement of uniform appearance can be expected. The amount of the higher boiling point organic solvent contained in the coating liquid is desirably 5 mass % or less with respect to the total amount of the coating liquid. Examples of the higher boiling point organic solvent include propylene glycol (boiling point: 187° C.), diethylene glycol monomethyl ether (boiling point: 193° C.), hexylene glycol (boiling point: 198° C.), and diethylene glycol (boiling point: 244° C.).

In the coating liquid of the present embodiment, the ratio between the mass of the fine silica particles, as calculated in terms of $SiO_2$, and the mass of a silicon oxide component contained in the hydrolyzable silicon compound, as calculated in terms of $SiO_2$ (fine silica particles:hydrolyzable silicon compound), is in the range of 57:43 to 74:26 and preferably in the range of 60:40 to 70:30.

In the coating liquid of the present embodiment, when the sum of the mass of the fine silica particles, as calculated in terms of $SiO_2$, and the mass of the silicon oxide component contained in the hydrolyzable silicon compound, as calculated in terms of $SiO_2$, is defined as 100 parts by mass, the amount of the aluminum chelate complex is in the range of 0.6 to 8 parts by mass and preferably in the range of 1 to 5 parts by mass.

Furthermore, when a low-reflection film having a thickness of 80 to 800 nm is formed on a transparent substrate using the coating liquid of the present embodiment, a transmittance gain can be 2.5% or more, the transmittance gain being defined as an increase of the average transmittance of the low-reflection film-coated transparent substrate in a wavelength range of 380 to 850 nm relative to the average transmittance of the transparent substrate uncoated with the low-reflection film in the wavelength range.

The coating liquid of the present embodiment may further contain a hydrolysis catalyst for the hydrolyzable silicon compound. Either an acid or a base can be used as the hydrolysis catalyst. From the viewpoint of the stability of the coating liquid, it is desirable to use an acid, particularly an inorganic acid, more particularly hydrochloric acid. This is because acidic conditions allow better dispersion of the fine silica particles and yield higher stability of the coating liquid than basic conditions. It is desirable to use as the hydrolysis catalyst an acid having a high degree of electrolytic dissociation in an aqueous solution. Specifically, it is desirable to use an acid having an acid dissociation constant pKa (which refers to the first acid dissociation constant when the acid is a polybasic acid) of 2.5 or less.

The method used to apply the coating liquid to a principal surface of a transparent substrate can be any known method such as spin coating, roll coating, bar coating, dip coating, or spray coating. The spray coating is superior in terms of mass production efficiency. Roll coating and bar coating are superior in terms of the uniformity of the appearance of the resulting film, as well as in terms of mass production efficiency.

It is preferable that, in the heating step of drying and hardening the wet film of the coating liquid, a maximum temperature experienced by a surface of the transparent substrate be 350° C. or lower, and a period of time during which the surface of the transparent substrate has a temperature of 130° C. or higher be 5 minutes or less. The heating in the heating step is preferably such that a period of time during which the surface of the transparent substrate has a temperature of 100° C. or higher is 30 seconds or more.

Based on the foregoing description, the method for producing the low-reflection film-coated transparent substrate of the present embodiment is, for example, a method including; an application step of applying a coating liquid for forming the low-reflection film to the transparent substrate; and a heating step of heating the transparent substrate with the coating liquid applied, wherein the coating liquid is the above-described coating liquid of the present embodiment, and in the heating step, a maximum temperature experienced by a surface of the transparent substrate is 350° C. or lower, and a period of time during which the surface of the transparent substrate has a temperature of 130° C. or higher is 5 minutes or less.

The low-reflection film-coated transparent substrate of the present embodiment can be employed as a glass sheet for use in a photoelectric conversion device. That is, a photoelectric conversion device according to an embodiment of the present invention includes the low-reflection film-coated transparent substrate of the present embodiment. An example of the photoelectric conversion device is a solar cell. In the photoelectric conversion device, the low-reflection film-coated transparent substrate is disposed in a manner such that the low-reflection film is on the light incident side. For components other than the glass sheet used on the light incident side of the photoelectric conversion device, namely the low-reflection film-coated transparent substrate of the present embodiment, components of known photoelectric conversion devices can be used as appropriate.

EXAMPLES

Hereinafter, the present invention will be described in more detail with Examples. For Examples and Comparative Examples, the method of measuring the thickness of low-reflection films each formed on a transparent substrate (a glass sheet in Examples and Comparative Examples) and the methods of evaluating various properties will be described first.

(Thickness of Low-Reflection Film)

The thickness of each low-reflection film was determined using a photograph taken with a field emission scanning electron microscope (FE-SEM). The low-reflection film was observed with a field emission scanning electron microscope ("S-4500", manufactured by Hitachi, Ltd.). The thickness of the low-reflection film was measured at five points in a FE-SEM photograph, taken from above at an angle of 30°, of a cross-section of the low-reflection film, and the average of the measured values was calculated as the thickness of the low-reflection film.

(Reflection Properties)

In Examples and Comparative Examples, as described below, a transparent conductive film-coated glass sheet was used as the transparent substrate of each low-reflection film-coated transparent substrate, and the low-reflection film was formed on that surface of the glass sheet on which the transparent conductive an was not provided. In reflectance measurement, to measure the reflectance of the low-reflection film alone, the transparent conductive an of the glass sheet was removed by sandblasting, and a black paint was applied to the sandblasted surface. A reflectance curve (reflection spectrum) of the surface of the glass sheet on which the low-reflection film was formed was measured using a spectrocolorimeter ("CM-2600d", manufactured by Konica Minolta, Inc.). Likewise, a reflectance curve was obtained in the same manner for the reflectance of the glass sheet that had not yet been coated with the low-reflection film. The reflectance of the glass sheet before low-reflection film formation and the reflectance of the glass sheet after low-reflection film formation were each averaged over the wavelength range of 360 to 740 nm to determine the average reflectance before low-reflection film formation and the average reflectance after low-reflection film formation. The average reflectance after low-reflection film formation was subtracted from the average reflectance before low-reflection film formation to determine a difference in average reflectance, and the reflectance-reducing effect was evaluated.

(Transmission Properties)

A transmittance curve (transmission spectrum) of the transparent substrate (a glass sheet in Examples and Comparative Examples) was measured using a spectrophotometer ("U-4100", manufactured by Hitachi High-Tech Science Corporation) before and after low-reflection film formation. The average transmittance was calculated by averaging the measured transmittance over the wavelength range of 380 to 850 nm. An increase of the average transmittance of the glass sheet coated with the low-reflection film relative to the average transmittance of the glass sheet uncoated with the low-reflection film was determined as a transmittance gain.

(Abrasion Resistance)

For each low-reflection film-coated transparent substrate, the surface formed by the low-reflection film was subjected to 70 or 250 cycles of abrasion with an abrasive, CS-10F, at a load of 4 N using a reciprocating abrasion tester (manufactured by Taber Industries). For the abraded portion subjected to 70 cycles of abrasion, a reflectance curve (reflection spectrum) was measured in the same manner as in the test in "Reflection properties" described above, and the average of visible reflectance in the wavelength range of 360 to 740 nm was determined. A difference between the average of visible reflectance as determined after 70 cycles of abrasion and the average of visible reflectance of the glass sheet as determined in the wavelength range of 360 to 740 nm before low-reflection film formation was calculated, and the reflectance-reducing effect after 70 cycles of abrasion was evaluated. For the abraded portion subjected to 250 cycles of abrasion, the change in visible reflectance of the portion before and after abrasion was measured using a spectrocolorimeter ("CM-2600d", manufactured by Konica Minolta, Inc.). The change in visible reflectance was determined based on the averages of visible reflectance in the wavelength range of 360 to 740 nm.

(Post-Water Immersion Abrasion Resistance)

Each low-reflection film-coated transparent substrate was immersed in water at 80° C. for 50 hours. Thereafter, the low-reflection film-coated transparent substrate was dried, and its surface formed by the low-reflection film was abraded using a reciprocating abrasion tester (manufacturing by Taber Industries). The abrasion was carried out by bringing a dry cloth (non-woven fabric) into contact with the low-reflection film and reciprocating the dry cloth four times with a load of 4 N applied to the low-reflection film. The average reflectance of the surface formed by the low-reflection film was measured after the abrasion test, and a difference from the average reflectance of the surface formed by the low-reflection film as measured before the abrasion test was calculated. The average reflectances were the averages of reflectance in the wavelength range of 360 to 740 nm, and the measurement method of the average reflectances was the same as that described in "Reflection properties" above.

Example 1

<Preparation of Coating Liquid>

An amount of 28.3 parts by mass of a fine silica particle dispersion ("Quartron PL-7", manufactured by Fuso Chemical Co., Ltd., containing approximately spherical primary particles with an average primary particle diameter of 125 nm, and having a solids concentration of 23 mass %), 58.6 parts by mass of 1-methoxy-2-propanol (solvent), and 1 part by mass of 1N hydrochloric acid (hydrolysis catalyst) were mixed by stirring. While the mixture was further stirred, 12.1 parts by mass of tetraethoxysilane (ethyl orthosilicate, manufactured by Tama Chemicals Co., Ltd.) was added. The stirring was further continued for 8 hours with the temperature maintained at 40° C., and the tetraethoxysilane was thus hydrolyzed to obtain a hydrolysate solution.

In the hydrolysate solution, the ratio between the mass of the fine silica particles, as calculated in terms of $SiO_2$, and the mass of the silicon oxide component contained in the binder, as calculated in terms of $SiO_2$, was 65:35, and the concentration of solids, as calculated in terms of $SiO_2$, was 10 mass %.

An amount of 85.00 g of the hydrolysate solution, 14.15 g of 1-methoxy-2-propanol (solvent), and 0.85 g of an aluminum chelate complex solution (a solution prepared by dissolving (ethylacetoacetato)aluminum dibutoxide, "DX-9740" manufactured by Shin-Etsu Chemical Co., Ltd., in 1-methoxy-2-propanol (solvent) to a concentration of 10 mass %) were mixed by stirring to obtain a coating liquid of Example 1. In the solids of the coating liquid, the content of the fine silica particles was 64.6 mass % as calculated in terms of $SiO_2$, the content of the silicon oxide component contained in the binder was 34.8 mass % as calculated in terms of $SiO_2$, the content of the aluminum compound was 0.17 mass % as calculated in terms of $Al_2O_3$, and the content of the organic component (organic component derived from a ligand of the aluminum chelate complex) was 0.42 mass %. The content of each component in the solids of the coating liquid corresponds to the content of the component in the low-reflection film to be formed. The same applies to Examples and Comparative Examples described below. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 1 part by mass.

<Formation of Low-Reflection Film>

In Example 1, a low-reflection film was formed on one principal surface of a transparent conductive film-coated glass sheet to obtain a low-reflection film-coated transparent substrate. This glass sheet was a transparent conductive film-coated glass sheet manufactured by Nippon Sheet Glass Co. Ltd. and having a thickness of 3.2 mm. This glass sheet had a typical soda-lime-silicate composition and had a transparent conductive film formed by on-line CVD on one principal surface and including a transparent conductive layer. The glass sheet was cut into a 200 mm×300 mm piece, which was immersed in an alkaline solution (LBC-1, an alkaline cleaning liquid manufactured by LEYBOLD Co., Ltd.) and washed with the aid of an ultrasonic cleaner. The piece of glass sheet was rinsed with deionized water and then dried at ordinary temperature to prepare a glass sheet for low-reflection film formation. The transmission properties of the glass sheet not provided with a low-reflection film were evaluated as described above, and the average transmittance was determined to be 83.2%.

In Example 1, a roll coater was used to apply the coating liquid of Example 1 to that principal surface of the above glass sheet which was not provided with the transparent conductive film. The application was done in such a manner that the film of the applied liquid would have a thickness of 1 to 5 µm. Next, the coating liquid applied to the glass sheet was dried and hardened by hot air. This hot air drying was accomplished by using a belt conveyor-type hot air dryer and passing the glass sheet under a hot air injection nozzle once, with the temperature of hot air set to 350° C., the distance between the nozzle and glass sheet set to 25 mm, and the conveyance speed set to 0.3 m/min. In this drying, the period of time during which the glass sheet with the coating liquid applied was in contact with hot air was 80 seconds, the period of time during which the glass surface with the coating liquid applied had a temperature of 130° C. or higher was 40 seconds, and the maximum temperature reached by the glass surface was 150° C. After the drying and hardening, the glass sheet was left to cool to room temperature to form a low-reflection film on the glass sheet.

For the low-reflection film-coated transparent substrate thus obtained, the various properties described above were evaluated. The results are shown in Table 1.

Example 2

<Preparation of Coating Liquid>

A coating liquid was prepared in the same manner as in Example 1, except that the amount of the hydrolysate solution was 85.00 g, the amount of 1-methoxy-2-propanol (solvent) was 13.30 g, and the amount of the aluminum chelate complex solution was 1.70 g. In the solids of this coating liquid, the content of the fine silica particles was 64.2 mass % as calculated in terms of $SiO_2$, the content of the silicon oxide component contained in the binder was 34.6 mass % as calculated in terms of $SiO_2$, the content of the aluminum compound was 0.33 mass % as calculated in terms of $Al_2O_3$, and the content of the organic component (organic component derived from a ligand of the aluminum chelate complex) was 0.84 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 2 parts by mass.

<Formation of Low-Reflection Film>

In Example 2, a low-reflection film was formed in the same manner as in Example 1, except for using the above coating liquid of Example 2, and the various properties described above were evaluated. The results are shown in Table 1.

Example 3

<Preparation of Coating Liquid>

A coating liquid was prepared in the same manner as in Example 1, except that the amount of the hydrolysate solution was 85.00 g, the amount of 1-methoxy-2-propanol (solvent) was 12.45 g, and the amount of the aluminum chelate complex solution was 2.55 g. In the solids of this coating liquid, the content of the fine silica particles was 63.9 mass % as calculated in terms of $SiO_2$, the content of the silicon oxide component contained in the binder was 34.4 mass % as calculated in terms of $SiO_2$, the content of the aluminum compound was 0.50 mass % as calculated in terms of $Al_2O_3$, and the content of the organic component (organic component derived from a ligand of the aluminum chelate complex) was 1.26 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 3 parts by mass.

<Formation of Low-Reflection Film>

In Example 3, a low-reflection film was formed in the same manner as in Example 1, except for using the above coating liquid of Example 3, and the various properties described above were evaluated. The results are shown in Table 1.

Example 4

<Preparation of Coating Liquid>

A coating liquid was prepared in the same manner as in Example 1, except that the amount of the hydrolysate solution was 85.00 g, the amount of 1-methoxy-2-propanol (solvent) was 10.75 g, and the amount of the aluminum chelate complex solution was 4.25 g. In the solids of this coating liquid, the content of the fine silica particles was 63.1 mass % as calculated in terms of $SiO_2$, the content of the silicon oxide component contained in the binder was 34.0 mass % as calculated in terms of $SiO_2$, the content of the aluminum compound was 0.82 mass % as calculated in terms of $Al_2O_3$, and the content of the organic component (organic component derived from a ligand of the aluminum chelate complex) was 2.07 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 5 parts by mass.

<Formation of Low-Reflection Film>

In Example 4, a low-reflection film was formed in the same manner as in Example 1, except for using the above coating liquid of Example 4, and the various properties described above were evaluated. The results are shown in Table 1.

Example 5

<Preparation of Coating Liquid>

In Example 5, a solution prepared by dissolving (ethylacetoacetato)aluminum diisopropoxide (manufactured by Wako Pure Chemical Industries, Ltd.) in 1-methoxy-2-propanol (solvent) to a concentration of 10 mass % was used as the aluminum chelate complex solution. An amount of 85.00 g of the hydrolysate solution, 13.30 g of 1-methoxy-2-propanol (solvent), and 1.700 g of the aluminum chelate complex solution were mixed by stirring. Except for this, a coating liquid was prepared in the same manner as in Example 1. In the solids of this coating liquid, the content of the fine silica particles was 64.2 mass % as calculated in terms of $SiO_2$, the content of the silicon oxide component contained in the binder was 34.5 mass % as calculated in terms of $SiO_2$, the content of the aluminum compound was 0.37 mass % as calculated in terms of $Al_2O_3$, and the content of the organic component (organic component derived from a ligand of the aluminum chelate complex) was 0.93 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 2 parts by mass.

<Formation of Low-Reflection Film>

In Example 5, a low-reflection film was formed in the same manner as in Example 1, except for using the above coating liquid of Example 5, and the various properties described above were evaluated. The results are shown in Table 1.

Comparative Example 1

<Preparation of Coating Liquid>

An aqueous aluminum chloride solution (a solution having an $AlCl_3$ concentration of 47.6 wt %, which was prepared by dissolving reagent grade aluminum chloride hexahydrate manufactured by Sigma-Aldrich Co., LLC. in deionized water) was used instead of any aluminum chelate complex solution. An amount of 85.00 g of the hydrolysate solution, 12.99 g of 1-methoxy-2-propanol (solvent), and 2.01 g of the aqueous aluminum chloride solution were mixed by stirring. Except for this, a coating liquid was prepared in the same manner as in Example 1. In the solids of this coating liquid, the content of the fine silica particles was 61.9 mass % as calculated in terms of $SiO_2$, the content of the silicon oxide component contained in the binder was 33.3 mass % as calculated in terms of $SiO_2$, the content of the aluminum compound was 4.7 mass % as calculated in terms of $Al_2O_3$, and the content of any organic component was 0 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as aluminum chloride was 6.5 parts by mass.

<Formation of Low-Reflection Film>

In Comparative Example 1, a low-reflection film was formed in the same manner as in Example 1, except for using the above coating liquid of Comparative Example 1, and the various properties described above were evaluated. It should be noted that in the test for evaluating the post-water immersion abrasion resistance, the time of immersion of the low-reflection film-coated transparent substrate in water was shortened to 20 hours. The results are shown in Table 2.

Comparative Example 2

<Preparation of Coating Liquid>

In Comparative Example 2, a coating liquid containing no aluminum compound was prepared. Specifically, a coating liquid was prepared in the same manner as in Example 1, except for mixing only 85.00 g of the hydrolysate solution and 15.00 g of 1-methoxy-2-propanol (solvent) by stirring without adding the aluminum chelate complex solution. In the solids of this coating liquid, the content of the fine silica particles was 65.0 mass % as calculated in terms of $SiO_2$, the content of the silicon oxide component contained in the binder was 35.0 mass % as calculated in terms of $SiO_2$, the content of any aluminum compound was 0 mass %, and the content of any organic component was 0 mass %.

<Formation of Low-Reflection Film>

In Comparative Example 2, a low-reflection film was formed in the same manner as in Example 1, except for using the above coating liquid of Comparative Example 2, and the various properties described above were evaluated. The results are shown in Table 2.

Comparative Example 3

<Preparation of Coating Liquid>

A coating liquid was prepared in the same manner as in Example 1, except that the amount of the hydrolysate solution was 85.00 g, the amount of 1-methoxy-2-propanol (solvent) was 14.575 g, and the amount of the aluminum chelate complex solution was 0.425 g. In the solids of this coating liquid, the content of the fine silica particles was 64.8 mass % as calculated in terms of $SiO_2$, the content of the silicon oxide component contained in the binder was 34.9 mass % as calculated in terms of $SiO_2$, the content of the aluminum compound was 0.084 mass % as calculated in terms of $Al_2O_3$, and the content of the organic component (organic component derived from a ligand of the aluminum chelate complex) was 0.21 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 0.5 parts by mass.

<Formation of Low-Reflection Film>

In Comparative Example 3, a low-reflection film was formed in the same manner as in Example 1, except for using the above coating liquid of Comparative Example 3, and the various properties described above were evaluated. The results are shown in Table 2.

Comparative Example 4

<Preparation of Coating Liquid>

In Comparative Example 4, a solution prepared by dissolving aluminum tris(acetylacetonate) (manufactured by Wako Pure Chemical Industries, Ltd.) in 1-methoxy-2-propanol (solvent) to a concentration of 10 mass % was used as the aluminum chelate complex solution. An amount of 85.00 g of the hydrolysate solution, 13.30 g of 1-methoxy-2-propanol (solvent), and 1.70 g of the aluminum chelate complex solution were mixed by stirring. Except for this, a coating liquid was prepared in the same manner as in Example 1. In the solids of this coating liquid, the content of the fine silica particles was 63.6 mass % as calculated in terms of $SiO_2$, the content of the silicon oxide component contained in the binder was 34.3 mass % as calculated in terms of $SiO_2$, the content of the aluminum compound was 0.31 mass % as calculated in terms of $Al_2O_3$, and the content of the organic component (organic component derived from a ligand of the aluminum chelate complex) was 1.80 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 2 parts by mass.

<Formation of Low-Reflection Film>

In Comparative Example 4, the aluminum chelate complex was not dissolved in the coating liquid, and film formation using the coating liquid was impossible.

Comparative Example 5

<Preparation of Coating Liquid>

In Comparative Example 5, a solution prepared by dissolving aluminum tris(ethyl acetoacetate) (manufactured by Wako Pure Chemical Industries, Ltd.) in 1-methoxy-2-propanol (solvent) to a concentration of 10 mass % was used as the aluminum chelate complex solution. An amount of 85.00 g of the hydrolysate solution, 13.30 g of 1-methoxy-2-propanol (solvent), and 1.70 g of the aluminum chelate complex solution were mixed by stirring. Except for this, a coating liquid was prepared in the same manner as in Example 1. In the solids of this coating liquid, the content of the fine silica particles was 63.7 mass % as calculated in terms of $SiO_2$, the content of the silicon oxide component contained in the binder was 34.3 mass % as calculated in terms of $SiO_2$, the content of the aluminum compound was 0.24 mass % as calculated in terms of $Al_2O_3$, and the content of the organic component (organic component derived from a ligand of the aluminum chelate complex) was 1.83 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 2 parts by mass.

<Formation of Low-Reflection Film>

In Comparative Example 5, the aluminum chelate complex was not dissolved in the coating liquid, and film formation using the coating liquid was impossible.

Comparative Example 6

<Preparation of Coating Liquid>

In Comparative Example 6, a solution prepared by dissolving aluminum tri-sec-butoxide (manufactured by Tokyo Chemical Industry Co., Ltd.) in 1-methoxy-2-propanol (solvent) to a concentration of 10 mass % was used instead of any aluminum chelate complex solution. An amount of 85.00 g of the hydrolysate solution, 13.30 g of 1-methoxy-2-propanol (solvent), and 1.70 g of the aluminum tri-sec-butoxide solution were mixed by stirring. Except for this, a coating liquid was prepared in the same manner as in Example 1. In the solids of this coating liquid, the content of the fine silica particles was 64.7 mass % as calculated in terms of $SiO_2$, the content of the silicon oxide component contained in the binder was 34.9 mass % as calculated in terms of $SiO_2$, the content of the aluminum compound was 0.41 mass % as calculated in terms of $Al_2O_3$, and the content of any organic component was 0 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as aluminum tri-sec-butoxide was 2 parts by mass.

<Formation of Low-Reflection Film>

In Comparative Example 6, the aluminum tri-sec-butoxide was not dissolved in the coating liquid, and film formation using the coating liquid was impossible.

Comparative Example 7

<Preparation of Coating Liquid>

A coating liquid was prepared in the same manner as in Example 1, except that the amount of the hydrolysate solution was 85.00 g, the amount of 1-methoxy-2-propanol (solvent) was 6.50 g, and the amount of the aluminum chelate complex solution was 8.5 g. In the solids of this coating liquid, the content of the fine silica particles was 61.3 mass % as calculated in terms of $SiO_2$, the content of the silicon oxide component contained in the binder was 33.0 mass % as calculated in terms of $SiO_2$, the content of the aluminum compound was 1.59 mass % as calculated in terms of $Al_2O_3$, and the content of the organic component (organic component derived from a ligand of the aluminum chelate complex) was 4.03 mass %. For this coating liquid, when the amount of an oxide of silicon (derived from the fine silica particles and tetraalkoxysilane) as calculated in terms of $SiO_2$ was defined as 100 parts by mass, the amount of the aluminum compound as the aluminum chelate complex was 10 parts by mass.

<Formation of Low-Reflection Film>

In Comparative Example 7, a low-reflection film was formed in the same manner as in Example 1, except for using the above coating liquid of Comparative Example 7, and the various properties described above were evaluated. It should be noted that in the test for evaluating the post-water immersion abrasion resistance, the time of immersion of the low-reflection film-coated transparent substrate in water was shortened to 30 hours. The results are shown in Table 2.

TABLE 1

| | | | | Example 1 | Example 2 | Example 3 | Example 4 | Example 5 |
|---|---|---|---|---|---|---|---|---|
| Low-reflection film | Fine silica particles | | Mass % | 64.6 | 64.2 | 63.9 | 63.1 | 64.2 |
| | Binder | Silica | Mass % | 34.8 | 34.6 | 34.4 | 34.0 | 34.5 |
| | | Aluminum compound | Mass %(*1) | 0.17 | 0.33 | 0.50 | 0.82 | 0.37 |
| | Organic component | | Mass % | 0.42 | 0.84 | 1.26 | 2.07 | 0.93 |
| | Thickness of low-reflection film | | nm | 140 | 140 | 140 | 140 | 140 |

TABLE 1-continued

|  |  |  |  | Example 1 | Example 2 | Example 3 | Example 4 | Example 5 |
|---|---|---|---|---|---|---|---|---|
| Coating liquid | Silica component | Fine particles | Mass ratio | 65 | 65 | 65 | 65 | 65 |
|  |  | Binder | Mass ratio | 35 | 35 | 35 | 35 | 35 |
|  | Aluminum compound | Type(*2) |  | Al(EAA)(OBu)$_2$ | Al(EAA)(OBu)$_2$ | Al(EAA)(OBu)$_2$ | Al(EAA)(OBu)$_2$ | Al(EAA)(OiPr)$_2$ |
|  |  | Parts by mass(*3) |  | 1 | 2 | 3 | 5 | 2 |
| Properties | Optical properties | Transmittance gain (%) |  | 2.55 | 2.67 | 2.72 | 2.71 | 2.71 |
|  |  | Reflectance-reducing effect (%) |  | 3.10 | 3.27 | 3.22 | 3.11 | 3.20 |
|  | Abrasion resistance | 70 cycles (%) |  | 2.45 | 2.53 | 2.50 | 2.40 | 2.45 |
|  |  | 250 cycles (%) |  | 1.28 | 1.27 | 1.30 | 1.35 | 1.43 |
|  | Post-water immersion abrasion resistance (%) |  |  | 0.51 | 0.22 | 0.12 | 0.25 | 0.31 |

(*1)Mass % of aluminum compound as calculated in terms of Al$_2$O$_3$
(*2)EAA: Ethyl acetoacetate, OBu: Butoxy group, OiPr: Isopropoxy group
(*3)Parts by mass withe respect to 100 parts by mass of silica component

TABLE 2

|  |  |  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|
| Low-reflection film | Fine silica particles |  | Mass % | 61.9 | 65.0 | 64.8 | 63.6 | 63.7 | 64.7 | 61.3 |
|  | Binder | Silica | Mass % | 33.3 | 35.0 | 34.9 | 34.3 | 34.3 | 34.9 | 33.0 |
|  |  | Aluminum compound | Mass %(*1) | 4.7 | 0 | 0.084 | 0.31 | 0.24 | 0.41 | 1.59 |
|  | Organic component |  | Mass % | 0 | 0 | 0.21 | 1.80 | 1.83 | 0 | 4.03 |
|  | Thickness of low-reflection film |  | nm | 140 | 140 | 140 | — | — | — | 140 |
| Coating liquid | Silica component | Fine particles | Mass ratio | 65 | 65 | 65 | 65 | 65 | 65 | 65 |
|  |  | Binder | Mass ratio | 35 | 35 | 35 | 35 | 35 | 35 | 35 |
|  | Aluminum compound | Type (*2) |  | AlCl$_3$ | — | Al(EAA)(OBu)$_2$ | Al(acac)$_3$ | Al(EAA)$_3$ | Al(OBU)$_3$ | Al(EAA)(OBu)$_2$ |
|  |  | Parts by mass(*3) |  | 6.5 | 0 | 0.5 | 2 | 2 | 2 | 10 |
| Properties | Optical properties | Transmittance gain (%) |  | 2.65 | 2.68 | 2.55 | Film formation was impossible (Al complex was not dissolved) | Film formation was impossible (Al complex was not dissolved) | Film formation was impossible (Al compound was not dissolved) | 2.70 |
|  |  | Reflectance-reducing effect (%) |  | 3.18 | 3.25 | 3.09 |  |  |  | 3.25 |
|  | Abrasion resistance | 70 cycles (%) |  | 2.12 | 2.55 | 2.43 |  |  |  | 1.95 |
|  |  | 250 cycles (%) |  | 1.56 | 1.44 | 1.30 |  |  |  | 1.81 |
|  | Post-water immersion abrasion resistance (%) |  |  | (3.06/20 h) | 2.42 | 2.16 |  |  |  | (2.7/30 h) |

(*1)Mass % of aluminum compound as calculated in terms of Al$_2$O$_3$
(*2)EAA: Ethyl acetoacetate, OBu: Butoxy group, acac: Acetylacetone
(*3)Parts by mass with respect to 100 parts by mass of silica component The low-reflection film-coated transparent substrates of Examples 1 to 5 exhibited excellent optical properties and also had high durability (high abrasion resistance and post-water immersion abrasion resistance). By contrast, the low-reflection film-coated transparent substrates of Comparative Examples 1 to 3 and 7 were inferior in durability, particularly in post-water immersion abrasion resistance, although they had good optical properties. In Comparative Examples 4 to 6, the aluminum compound (the aluminum chelate complex or the aluminum tri-sec-butoxide) was not sufficiently dissolved in the solvent in the coating liquid, and formation of a low-reflection film was impossible.

INDUSTRIAL APPLICABILITY

The present invention can provide a low-reflection film-coated transparent substrate having excellent optical properties and further having excellent durability.

The invention claimed is:

1. A low-reflection film-coated transparent substrate comprising a transparent substrate and a low-reflection film formed on at least one principal surface of the transparent substrate, wherein
the low-reflection film is a porous film comprising: fine silica particles being solid and spherical and having an average particle diameter of 80 to 150 nm; and a binder containing silica as a main component, the fine silica particles being bound by the binder,
the binder further contains an aluminum compound,
the low-reflection film contains as components:
55 to 70 mass % of the fine silica particles;
25 to 40 mass % of the silica of the binder;
0.1 to 1.5 mass % of the aluminum compound in terms of $Al_2O_3$; and
0.0.25 to 3 mass % of an organic component,
the low-reflection film has a thickness of 80 to 800 nm,
a transmittance gain is 2.5% or more, the transmittance gain being defined as an increase of average transmittance of the low-reflection film-coated transparent substrate in a wavelength range of 380 to 850 nm relative to average transmittance of the transparent substrate uncoated with the low-reflection film in the wavelength range,
the organic component comprises at least one selected from the group consisting of a β-ketoester and a β-diketone, and
the aluminum compound is an aluminum chelate complex, and the aluminum chelate complex contains at least one polydentate ligand selected from the group consisting of a polydentate ligand having a β-ketoester structure and a polydentate ligand having a β-diketone structure; and one or two alkoxy groups directly bonded to an aluminum atom in the aluminum chelate complex.

2. The low-reflection film-coated transparent substrate according to claim 1, wherein the number of carbon atoms in the or each alkoxy group is 1 to 8.

3. The low-reflection film-coated transparent substrate according to claim 2, wherein the or each alkoxy group is at least one selected from the group consisting of an i-propoxy group, a n-butoxy group, and a sec-butoxy group.

4. The low-reflection film-coated transparent substrate according to claim 1, wherein all of the polydentate ligands contained in the aluminum chelate complex have a β-ketoester structure.

5. The low-reflection film-coated transparent substrate according to claim 1, wherein
in the β-ketoester structure,
the number of carbon atoms in a carboxylic acid forming the ester is 4 to 6, and
the number of carbon atoms in an alcohol forming the ester is 1 to 3.

6. The low-reflection film-coated transparent substrate according to claim 5, wherein
in the β-ketoester structure,
the number of carbon atoms in the carboxylic acid forming the ester is 4, and
the number of carbon atoms in the alcohol forming the ester is 2.

7. The low-reflection film-coated transparent substrate according to claim 1, wherein
the silica of the binder is derived from a hydrolyzable silicon compound or a hydrolysate thereof added to a coating liquid for forming the low-reflection film, and
the hydrolyzable silicon compound comprises a compound represented by the following formula (I):

$$SiX_4 \qquad (I),$$

where X is at least one selected from an alkoxy group, an acetoxy group, an alkenyloxy group, an amino group, and a halogen atom.

8. The low-reflection film-coated transparent substrate according to claim 7, wherein the hydrolyzable silicon compound is a tetraalkoxysilane.

9. The low-reflection film-coated transparent substrate according to claim 1, wherein
when the low-reflection film-coated transparent substrate is subjected to a post-water immersion dry cloth rubbing test in which the low-reflection film-coated transparent substrate is immersed in water for 50 hours and subsequently a surface formed by the low-reflection film is rubbed with a dry cloth,
a difference in average reflectance of the surface formed by the low-reflection film in a wavelength range of 360 to 740 nm before and after the test is 1% or less.

10. The low-reflection film-coated transparent substrate according to claim 1, wherein
the low-reflection film is formed by a heating step performed after a coating liquid for forming the low-reflection film is applied to the transparent substrate, and
in the heating step,
a maximum temperature experienced by a surface of the transparent substrate is 350° C. or lower, and
a period of time during which the surface of the transparent substrate has a temperature of 130° C. or higher is 5 minutes or less.

11. The low-reflection film-coated transparent substrate according to claim 1, wherein the transparent substrate is a glass sheet.

12. The low-reflection film-coated transparent substrate according to claim 11, wherein a film comprising a transparent conductive layer is formed on a principal surface of the transparent substrate that is opposite to the principal surface on which the low-reflection film is formed.

13. A photoelectric conversion device comprising the low-reflection film-coated transparent substrate according to claim 1.

* * * * *